(12) United States Patent
Ishikawa

(10) Patent No.: US 6,678,194 B2
(45) Date of Patent: Jan. 13, 2004

(54) SENSE AMPLIFIER ARRANGEMENT FOR SEMICONDUCTOR MEMORY DEVICE

(75) Inventor: Toru Ishikawa, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/053,742

(22) Filed: Jan. 22, 2002

(65) Prior Publication Data
US 2002/0113253 A1 Aug. 22, 2002

(30) Foreign Application Priority Data
Jan. 24, 2001 (JP) ........................................ 2001-015899

(51) Int. Cl.[7] ............................................... G11C 7/00
(52) U.S. Cl. ..................................... 365/196; 365/207
(58) Field of Search .............................. 365/196, 203, 365/202, 190, 230.03, 230.06, 207

(56) References Cited
U.S. PATENT DOCUMENTS 5,546,349 A * 8/1996 Watanabe et al. ...... 365/230.04
5,715,211 A * 2/1998 Toda .......................... 365/233
5,732,010 A * 3/1998 Takashima et al. ........... 365/63

FOREIGN PATENT DOCUMENTS

JP 08-153391 6/1996
JP 09-045879 2/1997

OTHER PUBLICATIONS

English Bibliographies and Abstracts of JP 08–153391 and JP 09–045879.

* cited by examiner

Primary Examiner—Thong Le
(74) Attorney, Agent, or Firm—Darryl G. Walker; Bradley T. Sako

(57) ABSTRACT

A semiconductor memory device including a plurality of cell arrays (121 to 128) and a plurality of sense amplifier sections is disclosed. Adjacent cell arrays may have a sense amplifier section disposed between. Sense amplifiers (131 to 163) within a sense amplifier section may be connected to a bit line that is connected to a plurality of memory cells in more than one of the cell arrays (121 to 128). When a cell array (123) is activated, sense amplifier sections that may be distributed around edges of a plurality of cell arrays (122 to 124) may be activated to sense data from the activated cell array (123). In this way, current may be distributed and noise may be reduced. An activated bit line (227) may be adjacent to a precharged bit line (250) in a non-activated cell array (124). In this way, cross-talk between activated bit lines may be reduced.

20 Claims, 3 Drawing Sheets

US 6,678,194 B2

SENSE AMPLIFIER ARRANGEMENT FOR SEMICONDUCTOR MEMORY DEVICE

TECHNICAL FIELD

The present invention relates generally to a semiconductor memory device and more specifically to an arrangement of sense amplifiers and memory cell arrays in a semiconductor memory device.

BACKGROUND OF THE INVENTION

It is a continuing goal to make a semiconductor memory device finer in order to provide more memory cells on a single device, decrease chip size and/or reduce manufacturing costs. One such method of decreasing the chip size of a semiconductor memory device, such as a dynamic random access memory (DRAM), is to provide a plurality of cell arrays that have a row of shared sense amplifiers disposed between. Each shared sense amplifier selectively receives data from a bit line pair from one memory cell array or from a bit line pair from the adjacent memory cell array.

Referring now to FIG. 1, a plan view of a conventional semiconductor memory device is set forth in a schematic diagram and given the general reference character 500.

Conventional semiconductor device 500 of FIG. 1 has shared sense amplifiers arranged in a row between adjacent memory cell arrays. Each shared sense amplifier is connected to two bit line pairs (four bit lines).

Conventional semiconductor device 500 consists of cell arrays (521, 522, 523 and 524). Each cell array (521, 522, 523 and 524) has a plurality of bit lines.

Cell array 521 includes bit lines (601 to 624). Bit lines (601 to 624) are arranged in bit line pairs (601–602 to 623–624). Each bit line pair (601–602 to 623–624) includes a bit line and a complementary bit line. Likewise, cell arrays (522 to 524) respectively include bit lines (625 to 648, 649 to 672, and 673 to 696). Bit lines (625 to 648) are arranged in bit line pairs (625–626 to 647–648). Bit lines (649 to 672) are arranged in bit line pairs (649–650 to 671–672). Bit lines (673 to 696) are arranged in bit line pairs (673–674 to 695–696). Likewise, each bit line pair (625–626 to 647–648, 649–650 to 671–672, and 673–674 to 695–696) includes a bit line and a complementary bit line.

Cell array 521 has a row of unshared sense amplifiers (531 to 536) on one side and a row of shared sense amplifiers (537 to 542) on the other side. Bit line pairs (601–602 to 623–624) are respectively, alternatively connected to unshared sense amplifiers (531 to 536) and shared sense amplifiers (537 to 542). More specifically, bit line pair (601–602) is connected to unshared sense amplifier 531, bit line pair (602–603) is connected to shared sense amplifier 537, and so on, and bit line pair (623–624) is connected to shared sense amplifier 542.

Cell array 522 has the row of shared sense amplifiers (537 to 542) on one side and a row of shared sense amplifiers (543 to 548) on the other side. Bit line pairs (625–626 to 647–648) are respectively, alternatively connected to shared sense amplifiers (543 to 548) and shared sense amplifiers (537 to 542). More specifically, bit line pair (625–626) is connected to shared sense amplifier 543, bit line pair (627–628) is connected to shared sense amplifier 537, and so on, and bit line pair (647–648) is connected to shared sense amplifier 542.

Cell array 523 has the row of shared sense amplifiers (543 to 548) on one side and a row of shared sense amplifiers (549 to 554) on the other side. Bit line pairs (649–650 to 671–672) are respectively, alternatively connected to shared sense amplifiers (543 to 548) and shared sense amplifiers (549 to 554). More specifically, bit line pair (649–650) is connected to shared sense amplifier 543, bit line pair (651–652) is connected to shared sense amplifier 549, and so on, and bit line pair (671–672) is connected to shared sense amplifier 554.

Cell array 524 has a row of unshared sense amplifiers (555 to 560) on one side and a row of shared sense amplifiers (549 to 554) on the other side. Bit line pairs (673–674 to 695–696) are respectively, alternatively connected to unshared sense amplifiers (555 to 560) and shared sense amplifiers (549 to 554). More specifically, bit line pair (673–674) is connected to unshared sense amplifier 555, bit line pair (675–676) is connected to shared sense amplifier 549, and so on, and bit line pair (695–696) is connected to shared sense amplifier 554.

Conventional semiconductor device 500 includes sense amplifier drivers (501 to 510).

Unshared sense amplifiers (531 to 533) are connected to sense amplifier driver 501.

Unshared sense amplifiers (534 to 536) are connected to sense amplifier driver 502. Shared sense amplifiers (537 to 539) are connected to sense amplifier driver 503. Shared sense amplifiers (540 to 542) are connected to sense amplifier driver 504. Shared sense amplifiers (543 to 545) are connected to sense amplifier driver 505. Shared sense amplifiers (546 to 548) are connected to sense amplifier driver 506. Shared sense amplifiers (549 to 551) are connected to sense amplifier driver 507. Shared sense amplifiers (552 to 554) are connected to sense amplifier driver 508. Shared sense amplifiers (555 to 557) are connected to sense amplifier driver 509. Shared sense amplifiers (558 to 560) are connected to sense amplifier driver 510.

In semiconductor memory device 500, cell arrays (521 to 524) are conceptualized as $(N-1)^{th}$ to $(N+2)^{th}$ cell arrays, respectively, where N is an integer of 2 or more. Sense amplifier drivers (501 and 502), and unshared sense amplifiers (531 to 536) are conceptualized as a $(N-1)^{th}$ sense amplifier section. Sense amplifier drivers (503 and 504), and shared sense amplifiers (537 to 542) are conceptualized as a $N^{th}$ sense amplifier section. Sense amplifier drivers (505 and 506), and shared sense amplifiers (543 to 548) are conceptualized as a $(N+1)^{th}$ sense amplifier section. Sense amplifier drivers (507 and 508), and shared sense amplifiers (549 to 554) are conceptualized as a $(N+2)^{th}$ sense amplifier section. Sense amplifier drivers (509 and 510), and unshared sense amplifiers (555 to 560) are conceptualized as a $(N+3)^{th}$ sense amplifier section.

In conventional semiconductor memory device 500, when $N^{th}$ cell array 522 is activated, for example, $N^{th}$ sense amplifier section (including sense amplifier drivers (503 and 504) is activated and $(N+1)^{th}$ sense amplifier section (including sense amplifier drivers (505 and 506) is activated. In this way, sense amplifiers (537 to 548) are activated to read data on bit lines (625 to 648) connected to the selected side of sense amplifiers (537 to 548). In FIG. 1, the sense amplifiers (537 to 548) activated when $N^{th}$ cell array 522 is activated are illustrated with hatching.

In conventional semiconductor memory device 500, each sense amplifier section is configured to include one sense amplifier for every two bit line pairs (four bit lines), so that adjacent sense amplifiers in one sense amplifier section are not connected to adjacent bit lines. Instead adjacent sense amplifiers in each sense amplifier section are electrically separated by two bit lines (one bit line pair).

Also, adjacent sense amplifiers in each sense amplifier section are driven by a different sense amplifier driver (501 to 510). For example, although N$^{th}$ sense amplifier section includes sense amplifiers (537 to 542), sense amplifiers (537 to 539) are connected to be driven by sense amplifier driver 503 and sense amplifiers (540 to 542) are connected to be driven by sense amplifier driver 504. Such an arrangement of sense amplifiers arranged to be driven by separate sense amplifier drivers is disclosed in Japanese Laid-Open Patent Publication No. Hei 9-45879, entitled "Dynamic RAM."

By providing a sense amplifier driver for every other sense amplifier in a sense amplifier section, a sense amplifier driver provides current to every fourth bit line pair. However, in the conventional semiconductor device 500, each sense amplifier in a row of sense amplifiers is activated. Because sense amplifiers are disposed in as narrow pitch as feasibly possible, the noise generated by sense amplifiers upon activation is in a concentrated region. This can cause adverse affects during the sensing operation.

Also, in the conventional semiconductor memory device 500, bit lines (601 to 696) are arranged to span the width of a cell array (521 to 524). Thus, for example, when N$^{th}$ cell array 522 is activated and bit lines (625 to 648) provide corresponding data values, adjacent bit lines can be affected by "cross-talk." It is noted that an adjacent bit lines are running in parallel for essentially the width of the cell array. Thus, there is a maximum cross-talk between adjacent bit lines. The cross-talk induced noise can have adverse affects on, for example the access speed or data integrity during the operation of reading data.

In light of the above discussion, it would be desirable to provide a semiconductor memory device where the dispersion of sense amplifiers may be such that a large group of adjacent sense amplifiers may not be activated simultaneously. It would also be desirable to provide a semiconductor memory device that may have reduced coupling noise (cross-talk) between adjacent bit lines. It would also be desirable to provide a semiconductor memory device that may have a reduced chip size.

SUMMARY OF THE INVENTION

A semiconductor memory device according to the present embodiments may include a plurality of cell arrays and a plurality of sense amplifier sections. Adjacent cell arrays may have a sense amplifier section disposed between. Sense amplifiers within a sense amplifier section may be connected to a bit line that is connected to a plurality of memory cells in more than one of the cell arrays. When a cell array is activated, sense amplifier sections that may be distributed around edges of a plurality of cell arrays may be activated to sense data from the activated cell array. In this way, current may be distributed and noise may be reduced. An activated bit line may be adjacent to a precharged bit line in a non-activated cell array. In this way, cross-talk between activated bit lines may be reduced.

According to one aspect of the embodiments, semiconductor memory device may include a plurality of cell arrays with adjacent cell arrays separated by a row of sense amplifiers. A plurality of bit lines may be included where each bit line may be connected to a plurality of memory cells in each of the plurality of cell arrays. Each bit line of the plurality of bit lines may be connected to a sense amplifier not included in the row of sense amplifiers separating the adjacent cell arrays in the plurality of cell arrays.

According to another aspect of the embodiments, each sense amplifier in the row of sense amplifiers separating adjacent cell arrays is connected to a bit line, separate from the plurality of bit lines, in each of the adjacent cell arrays.

According to another aspect of the embodiments, the plurality of bit lines may be a plurality of complementary bit line pairs According to another aspect of the embodiments, adjacent ones of the plurality of bit lines may be separated by at least one bit line separate from the plurality of bit lines and that may be connected to a plurality of memory cells in a different cell array from the plurality of cell arrays.

According to another aspect of the embodiments, the semiconductor memory device may be a dynamic random access memory.

According to another aspect of the embodiments, a semiconductor memory device may include a plurality of cell arrays and a plurality of sense amplifier sections. Each cell array may include a plurality of memory cells. Each sense amplifier section may include a plurality of sense amplifiers provided adjacent to one of the plurality of cell arrays. Each sense amplifier may be connected to a bit line that may be connected to memory cells in at least two cell arrays of the plurality of cell arrays.

According to another aspect of the embodiments, the plurality of cell arrays may be disposed in a first direction parallel to the bit line. The plurality of cell arrays may include a first cell array adjacent to a second cell array. The plurality of sense amplifier sections may include a first sense amplifier section on a first side of the first cell array and a second sense amplifier section on a second side of the first cell array and disposed between the first and second cell arrays. When the first cell array is activated, the first and second sense amplifier sections may be activated. When the second cell array is activated, the first and second sense amplifier sections may be activated.

According to another aspect of the embodiments, a semiconductor memory device may include a third sense amplifier section on the opposite side of a second cell array from a second sense amplifier section. When a first cell array is activated, the first, second and third sense amplifier sections may be activated. When the second cell array is activated, the first second and third sense amplifier sections may be activated.

According to another aspect of the embodiments, each sense amplifier section may include a sense amplifier driver coupled to the plurality of sense amplifiers.

According to another aspect of the embodiments, the plurality of cell arrays may include an end cell array. The plurality of sense amplifiers sections may include an end sense amplifier section. A sense amplifier driver in the end sense amplifier section may have a smaller drive strength than the sense amplifier driver in other ones of the plurality of sense amplifier sections.

According to another aspect of the embodiments, each bit line may be a complementary bit line pair. Adjacent sense amplifiers in each of the plurality of sense amplifier sections may be connected to complementary bit line pairs that may be separated by at least three complementary bit line pairs.

According to another aspect of the embodiments, the plurality of cell arrays may include an end cell array. The plurality of sense amplifier sections may include an end sense amplifier sections. The plurality of sense amplifiers in sense amplifier sections disposed between adjacent cell arrays may be shared sense amplifiers. The plurality of sense amplifiers in the end sense amplifier section may be unshared sense amplifiers.

According to another aspect of the embodiments, a semiconductor memory device may include a first cell array and a second cell array. A first sense amplifier section may include a plurality of sense amplifiers on a first side of the first cell array. A second sense amplifier section may include a plurality of sense amplifiers on an opposite side of the first cell array and between the first and second cell array. Each one of the plurality of sense amplifiers in the first sense amplifier section may be electrically connected to a bit line that may be connected to a plurality of memory cells in the first cell array and a plurality of memory cells in the second cell array.

According to another aspect of the embodiments, each one of the plurality of sense amplifiers in the second sense amplifier section may be electrically connected to a bit line that may be connected to a plurality of memory cells in the first cell array and to a separate bit line that may be electrically connected to a plurality of memory cells in the second cell array.

According to another aspect of the embodiments, when the first cell array is active, at least one of the bit lines that is connected to a plurality of memory cells in the first cell array and a plurality of memory cells in the second cell array may be adjacent to a bit line in the second cell array that is in a precharge state.

According to another aspect of the embodiments, when the first cell array is active, the at least one of the bit lines that is connected to a plurality of memory cells in the first cell array and a plurality of memory cells in the second cell array may be adjacent to a bit line in the first cell array that is providing data.

According to another aspect of the embodiments, a third sense amplifier section may include a plurality of sense amplifiers on the opposite side of the second cell array. Each one of the plurality of sense amplifiers in the third sense amplifier section may be electrically connected to a bit line that may be connected to a plurality of memory cells in the first cell array and a plurality of memory cells in the second cell array.

According to another aspect of the embodiments, when one of the plurality of memory cells in the first cell array is selected, the first, second, and third sense amplifier sections may be activated. When one of the plurality of memory cells in the second cell array is selected, the first, second and third sense amplifier sections may be activated.

According to another aspect of the embodiments, a third memory cell array may have the third sense amplifier section on a first side of the third memory cell array. A fourth sense amplifier section may be on an opposite side of the third memory cell array. When one of the plurality of memory cells in the second cell array is selected, the first, second, third, and fourth sense amplifier sections are activated.

According to another aspect of the embodiments, each bit line may include a complementary bit line pair. Adjacent bit line pairs connected to sense amplifiers in the first sense amplifier section may be separated by a plurality of bit lines that are connected to sense amplifiers in a sense amplifier section other than the first sense amplifier section.

DETAILED DESCRIPTION OF THE EMBODIMENTS

Various embodiments of the present invention will now be described in detail with reference to a number of drawings.

Figure 2:
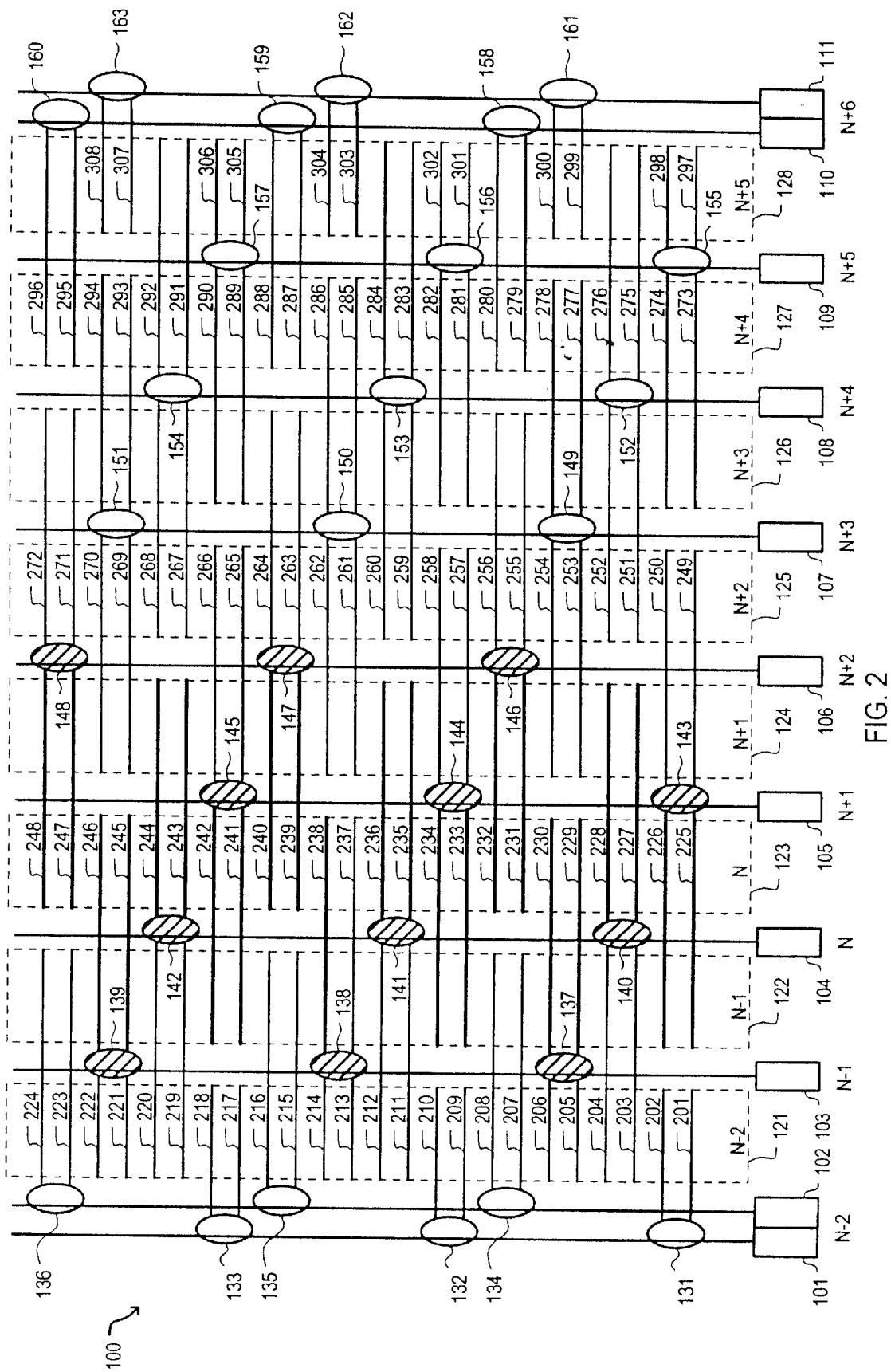
FIG. 2 is a plan view illustrating a semiconductor memory device according to one embodiment.

Referring now to FIG. 2, a plan view illustrating a semiconductor memory device according to one embodiment is set forth and given the general reference character 100.

Semiconductor memory device 100 may include cell arrays (121 to 128) disposed in a column or bit line direction. Cell arrays (121 to 128) may be conceptualized as $(N-2)^{th}$ to $(N+5)^{th}$ cell arrays, respectively, where N is a number greater than 2. Sense amplifier driver sections may be included on each side of a memory cell array (121 to 128). Sense amplifier sections maybe conceptualized as $(N-2)^{th}$ to $(N+6)^{th}$ sense amplifier sections. $(N-1)^{th}$ to $(N+5)^{th}$ sense amplifier sections may be shared sense amplifier sections disposed between adjacent cell arrays (121 to 128). For example, $N^{th}$ sense amplifier section may be disposed between cell arrays (122 and 123). However, $(N-2)^{th}$ to $(N+6)^{th}$ sense amplifier sections may be unshared sense amplifier sections and may be at an outside edge of end cell arrays (121 and 128), respectively.

It is noted that FIG. 2 may simply illustrate a portion of semiconductor memory device 100 and there may be additional bit lines, sense amplifiers, and even memory cell arrays, etc. included.

Bit lines (201 to 308) may be arranged into bit line pairs. A bit line pair may be complementary such that one bit line may contain data while the complementary bit line may contain complementary data.

$(N-2)^{th}$ sense amplifier section may include sense amplifier drivers (101 and 102) and sense amplifiers (131 to 136). Sense amplifiers (131 to 136) may be unshared sense amplifiers. Sense amplifiers (131 to 133) may be driven by sense amplifier driver 101. Sense amplifiers (131 to 133) may be connected to bit line pairs (201–202, 209–210, and 217–218), respectively. Bit line pairs (201–202, 209–210, and 217–218) may be connected to a plurality of memory cells in cell array 121. Sense amplifiers (134 to 136) may be driven by sense amplifier driver 102. Sense amplifiers (134 to 136) may be connected to bit line pairs (207–208, 215–216, and 223–224), respectively. Bit line pairs (207–208, 215–216, and 223–224) may be connected with a plurality of memory cells in cell arrays (121 and 122).

$(N-1)^{th}$ sense amplifier section may include sense amplifier driver 103 and sense amplifiers (137 to 139). Sense amplifiers (137 to 139) may be shared sense amplifiers. Sense amplifiers (137 to 139) may be driven by sense amplifier driver 103. Sense amplifiers (137 to 139) may be connected to bit line pairs (205–206, 213–214, and 221–222), respectively, on one side and bit line pairs (229–230, 237–238, and 245–246), respectively, on another side. Bit line pairs (205–206, 213–214, and 221–222) may be connected to a plurality of memory cells in cell array 121. Bit line pairs (229–230, 237–238, and 245–246) may be connected with a plurality of memory cells in cell arrays (122 and 123).

$N^{th}$ sense amplifier section may include sense amplifier driver 104 and sense amplifiers (140 to 142). Sense amplifiers (140 to 142) may be shared sense amplifiers. Sense amplifiers (140 to 142) may be driven by sense amplifier driver 104. Sense amplifiers (140 to 142) may be connected to bit line pairs (203–204, 211–212, and 219–220), respectively, on one side and bit line pairs (227–228,

235–236, and 243–244), respectively, on another side. Bit line pairs (203–204, 211–212, and 219–220) may be connected to a plurality of memory cells in cell arrays (121 and 122). Bit line pairs (227–228, 235–236, and 243–244) may be connected with a plurality of memory cells in cell arrays (123 and 124).

(N+1)$^{th}$ sense amplifier section may include sense amplifier driver 105 and sense amplifiers (143 to 145). Sense amplifiers (143 to 145) may be shared sense amplifiers. Sense amplifiers (143 to 145) may be driven by sense amplifier driver 105. Sense amplifiers (143 to 145) may be connected to bit line pairs (225–226, 233–234, and 241–242), respectively, on one side and bit line pairs (249–250, 257–258, and 265–266), respectively, on another side. Bit line pairs (225–226, 233–234, and 241–242) may be connected to a plurality of memory cells in cell arrays (122 and 123). Bit line pairs (249–250, 257–258, and 265–266) may be connected with a plurality of memory cells in cell arrays (124 and 125).

(N+2)$^{th}$ sense amplifier section may include sense amplifier driver 106 and sense amplifiers (146 to 148). Sense amplifiers (146 to 148) may be shared sense amplifiers. Sense amplifiers (146 to 148) may be driven by sense amplifier driver 106. Sense amplifiers (146 to 148) may be connected to bit line pairs (231–232, 239–240, and 247–248), respectively, on one side and bit line pairs (255–256, 263–264, and 271–272), respectively, on another side. Bit line pairs (231–232, 239–240, and 247–248) may be connected to a plurality of memory cells in cell arrays (123 and 124). Bit line pairs (255–256, 263–264, and 271–272) may be connected with a plurality of memory cells in cell arrays (125 and 126).

(N+3)$^{th}$ sense amplifier section may include sense amplifier driver 107 and sense amplifiers (149 to 151). Sense amplifiers (149 to 151) may be shared sense amplifiers. Sense amplifiers (149 to 151) may be driven by sense amplifier driver 107. Sense amplifiers (149 to 151) may be connected to bit line pairs (253–254, 261–262, and 269–270), respectively, on one side and bit line pairs (277–278, 285–286, and 293–294), respectively, on another side. Bit line pairs (253–254, 261–262, and 269–270) may be connected to a plurality of memory cells in cell arrays (124 and 125). Bit line pairs (277–278, 285–286, and 293–294) may be connected with a plurality of memory cells in cell arrays (126 and 127).

(N+4)$^{th}$ sense amplifier section may include sense amplifier driver 108 and sense amplifiers (152 to 154). Sense amplifiers (152 to 154) may be shared sense amplifiers. Sense amplifiers (152 to 154) may be driven by sense amplifier driver 108. Sense amplifiers (152 to 154) may be connected to bit line pairs (251–252, 259–260, and 267–268), respectively, on one side and bit line pairs (275–276, 283–284, and 291–292), respectively, on another side. Bit line pairs (251–252, 259–260, and 267–268) may be connected to a plurality of memory cells in cell arrays (125 and 126). Bit line pairs (275–276, 283–284, and 291–292) may be connected with a plurality of memory cells in cell arrays (127 and 128).

(N+5)$^{th}$ sense amplifier section may include sense amplifier driver 109 and sense amplifiers (155 to 157). Sense amplifiers (155 to 157) may be shared sense amplifiers. Sense amplifiers (155 to 157) may be driven by sense amplifier driver 109. Sense amplifiers (155 to 157) may be connected to bit line pairs (273–274, 281–282, and 289–290), respectively, on one side and bit line pairs (297–298, 301–302, and 305–306), respectively, on another side. Bit line pairs (273–274, 281–282, and 289–290) may be connected with a plurality of memory cells in cell arrays (126 and 127). Bit line pairs (297–298, 301–302, and 305–306) may be connected to a plurality of memory cells in cell array 128.

(N+6)$^{th}$ sense amplifier section may include sense amplifier drivers (110 and 111) and sense amplifiers (158 to 163). Sense amplifiers (158 to 163) may be unshared sense amplifiers. Sense amplifiers (158 to 160) may be driven by sense amplifier driver 110. Sense amplifiers (158 to 160) may be connected to bit line pairs (279–280, 287–288, and 295–296), respectively. Bit line pairs (279–280, 287–288, and 295–296) may be connected with a plurality of memory cells in cell arrays (127 and 128). Sense amplifiers (161 to 163) may be driven by sense amplifier driver 111. Sense amplifiers (161 to 163) may be connected to bit line pairs (299–300, 303–304, and 307–308), respectively. Bit line pairs (299–300, 303–304, and 307–308) may be connected to a plurality of memory cells in cell array 128.

Shared sense amplifiers (137 to 157) may selectively sense data on a bit line pair on either side. In this way, shared sense amplifiers (137 to 157) may selectively amplify data signals provided on one of two bit line pairs. Shared sense amplifiers (140 to 154) may be connected to bit lines that are electrically connected to a plurality of memory cells from two adjacent cell arrays. Thus, sense amplifier drivers (104 to 108) may drive sense amplifiers that sense data on bit lines that are connected to adjacent cell arrays. For example, sense amplifiers (146 to 148) of (N+2)$^{th}$ sense amplifier section may be driven by sense amplifier driver 106 and may sense data from any one of four different cell arrays (123 to 126) or the N$^{th}$, (N+1)$^{th}$, (N+2)$^{th}$, or (N+3)$^{th}$ cell arrays. In contrast, sense amplifiers (137 to 139 and 155 to 157) driven respectively by sense amplifier drivers (103 and 109) may be connected to bit lines that may only be connected to memory cells in one cell array (121 and 128) and to bit lines that may be connected to memory cells in adjacent memory cell arrays (122–123 and 126–127).

Each sense amplifier (131 to 133 and 161 to 163), respectively, driven by end sense amplifier drivers (101 and 111) may be connected only to bit lines connected to memory cells in an end cell array (121 and 128). However, each sense amplifier (134 to 136 and 158 to 160), respectively, driven by sense amplifier drivers (102 and 110) may be connected only to bit lines connected to memory cells in an end cell array (121 and 128) and an adjacent cell array (122 and 127). In this way, sense amplifier drivers (101 and 111) may drive smaller loads than sense amplifier drivers (102 and 110).

The operation of semiconductor memory device 100 will now be described. In the example N$^{th}$ cell array may be activated. When N$^{th}$ cell array is activated, a selected word line (not shown) may be activated and data may be transferred from a row of memory cells onto bit lines (225 to 248). Then, (N−1)$^{th}$, N$^{th}$, (N+1)$^{th}$, and (N+2)$^{th}$ sense amplifier sections may be activated. More specifically, sense amplifier drivers (103 to 107) may be activated to drive sense amplifiers (137 to 148). Thus, data on bit lines (225 to 248) may be sensed. In this way, data from a selected row in N$^{th}$ cell array may be read into sense amplifiers (137 to 148).

In FIG. 2, bit lines (225 to 248) and sense amplifiers (137 to 148) activated in the above-mentioned operation of semiconductor memory device 100, are illustrated, respectively, with thicker lines and hatching.

Figure 1:
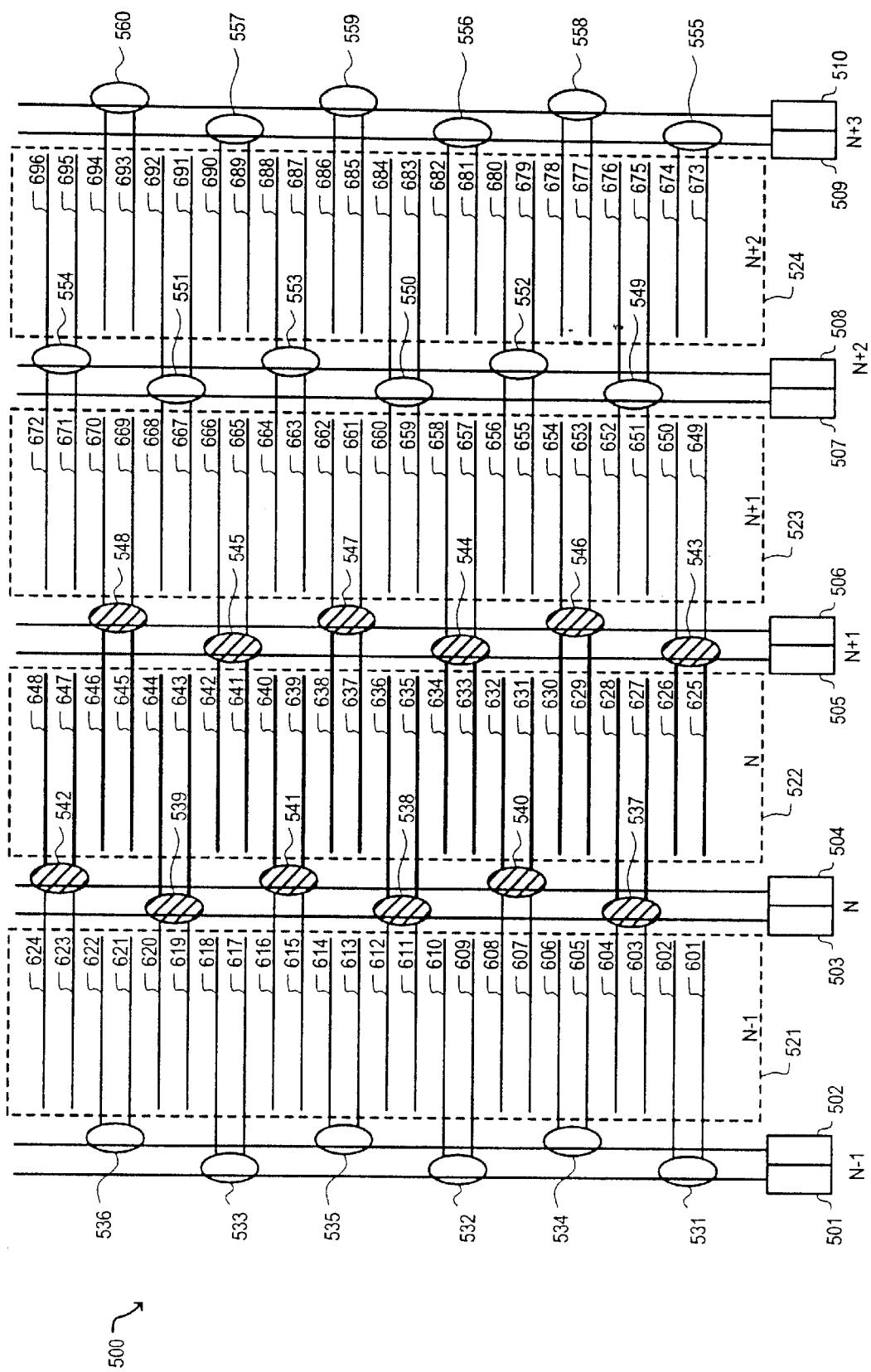
FIG. 1 is a plan view of a conventional semiconductor memory device.

In contrast, in the conventional semiconductor memory device 500 illustrated in FIG. 1, when N$^{th}$ cell array 522 is activated, $N^{th}$ and $(N+1)^{th}$ sense amplifier sections (sense amplifier drivers (503 to 506) and sense amplifiers (537 to 548)) are activated. Activated sense amplifiers (537 to 548) are illustrated with hatching. At this time, bit lines (625 to 648), as indicated by thickened lines, are connected to their respective activated sense amplifier (537 to 548) and data is sensed.

In conventional semiconductor device 500 of FIG. 1, it is noted that sense amplifiers in one sense amplifier section (for example sense amplifiers 537 to 542 in $N^{th}$ sense amplifier section) are connected to every other bit line pair. However, in semiconductor memory device 100 as illustrated in FIG. 2, sense amplifiers in one sense amplifier section (for example sense amplifiers (140 to 142) in $N^{th}$ sense amplifier section) may be connected to every fourth bit line pair. For example, sense amplifier 140 may be connected to bit line pair (227–228) while sense amplifier 141 may be connected to bit line pair (235–236) and bit line pairs (229–230, 231–232, and 233–234) may be disposed between. In this way, the pitch of the sense amplifier may be made larger, as just one example. This may provide for a layout advantage for the sense amplifier. Also, activated sense amplifiers in one sense amplifier section may be separated by a greater distance than conventional approaches, which may decrease adverse noise affects among such activated sense amplifiers, as just one example.

It is noted that end sense amplifier section, such as $(N-2)^{th}$ and $(N+6)^{th}$ sense amplifier sections may include a sense amplifiers more densely arranged than other sense amplifier sections of the embodiment. However, the end sense amplifier sections may be on an edge of a group of cell arrays and layout in these areas may be more relaxed than areas between adjacent cell arrays.

In conventional semiconductor device 500, $N^{th}$ sense amplifier section and $(N+1)^{th}$ sense amplifier section may be activated when $N^{th}$ cell array is activated. Two sense amplifier drivers, for example sense amplifier drivers (503 and 504) may be activated to drive sense amplifiers (537 to 542) in one section. Thus, a large drive current may be concentrated in one particular area on the chip. However, in semiconductor device 100, $(N-1)^{th}$, $(N+1)^{th}$, and $(N+2)^{th}$ sense amplifier sections may be activated when $N^{th}$ cell array is activated. Each sense amplifier section may be separated by a cell array (for example $N^{th}$ and $(N+1)^{th}$ sense amplifier sections may be separated by $N^{th}$ cell array). In this way, drive current may be distributed among a larger area of the chip. Thus, noise affects due to current spike, etc, may be reduced.

In conventional semiconductor memory device 500, bit lines are disposed such that a particular bit line runs the length of the adjacent bit line. For example, in $N^{th}$ cell array, bit line 633 runs the length of adjacent bit line 632, thus there can be maximum cross-talk due to coupling. However, in semiconductor memory device 100, a bit line may only essentially run one-half the length of an adjacent bit line. For example, in $N^{th}$ cell array, bit line 233 may only run essentially half the length of adjacent bit line 232, thus cross-talk due to coupling may be reduced. Also, the other half of bit line 233 may run adjacent to bit line 208. However, it should be noted that bit line 208 may still remain in a precharged condition when $N^{th}$ cell array is activated. In this way, bit line 208 may not essentially contribute to cross-talk due to coupling. In this way, adverse affects due to noise may be reduced.

Although in the embodiment illustrated in FIG. 2, bit lines may be disposed over two adjacent cell arrays, it is possible to dispose bit lines over any plurality of cell arrays, as just an example.

Figure 3:
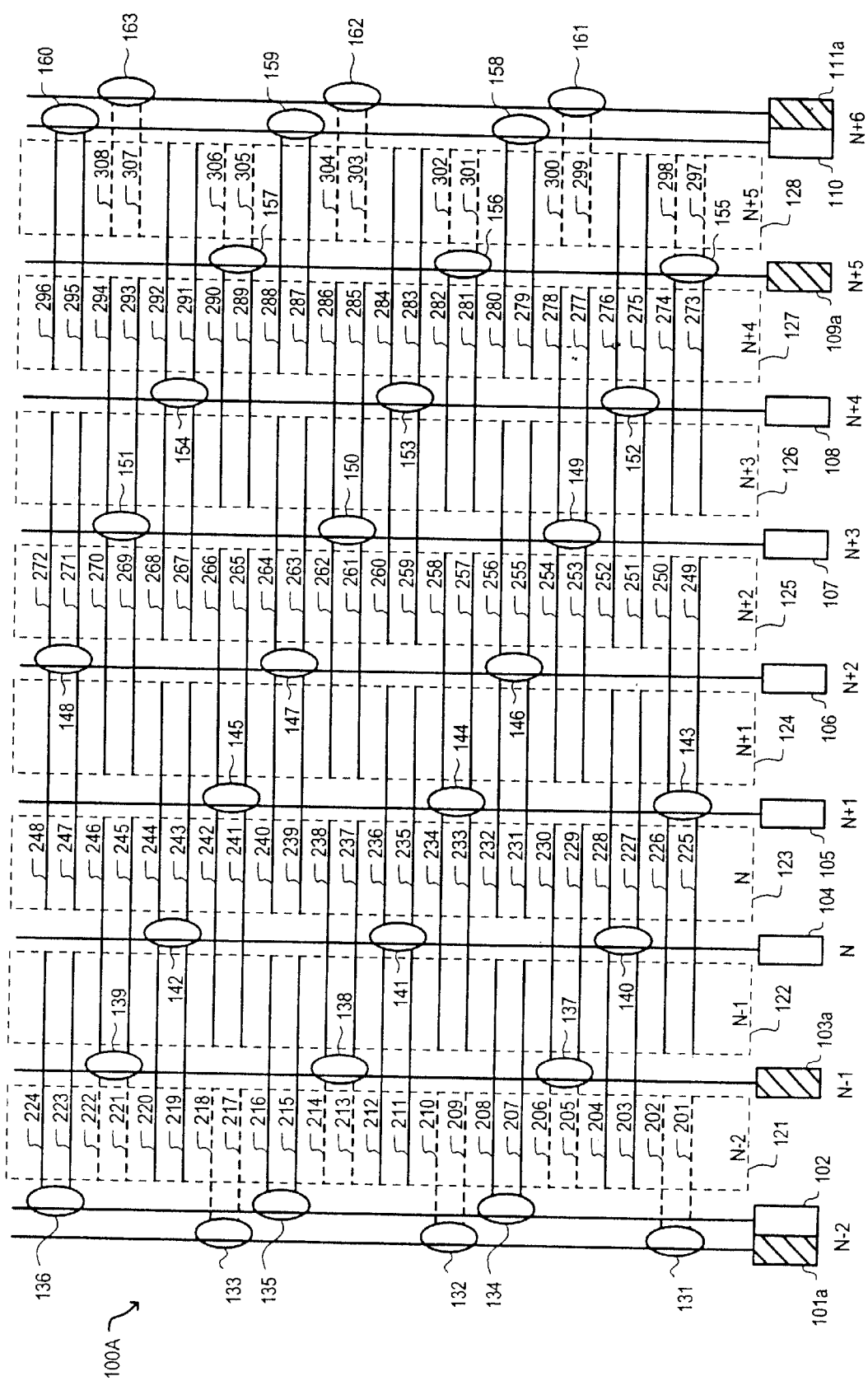
FIG. 3 is a plan view illustrating a semiconductor memory device according to another embodiment.

Referring now to FIG. 3, a plan view illustrating a semiconductor memory device according to another embodiment is set forth and given the general reference character 100A.

Semiconductor memory device 100A may have similar constituents as semiconductor memory device 100 and such constituents may be given the same general reference character.

In semiconductor memory device 100A, bit lines that may only be connected to a plurality of memory cells in an end cell array (121 and 128) may be illustrated with a dashed line. Such bit lines may include bit line (201, 202, 205, 206, 209, 210, 213, 214, 217, 218, 221, and 222) and bit lines (297 to 308). Because the bit lines (201, 202, 205, 206, 209, 210, 213, 214, 217, 218, 221, and 222) and bit lines (297 to 308) may only have approximately one-half the capacitance as a bit line connected to a plurality of memory cells in two adjacent cell arrays, semiconductor memory device may include sense amplifier drivers (101a, 103a, 109a and 111a) that may have a reduced drive strength when an end cell array (121 and 128) is activated. In this way, shorter bit lines may not be switched with an excessive drive and switching noise may be suppressed. However, when, for example cell array (122 or 127) is activated sense amplifier drivers (103a and 109a) may have a normal drive to ensure adequate current supply to $(N-1)^{th}$ and $(N+5)^{th}$ sense amplifier sections to allow bit lines connected to a plurality of memory cells in two adjacent cell arrays to be properly switched.

In accordance with the embodiments, bit line pairs may be connected to a plurality of memory cells in more than one cell array. Also, a bit line pair may be offset from an adjacent bit line by essentially one-half a bit line length. In this way, sense amplifiers may be arranged so that activated sense amplifiers may be distributed and separated among a plurality of cell arrays. In this way, current may be distributed in a larger area of the chip.

Also, adjacent sense amplifiers in a sense amplifier section may be separated by four bit line pairs. In this way, sense amplifier pitch may be increased and layout restrictions of the sense amplifier may be relaxed. Also, current may be more evenly distributed in a sense amplifier section and noise may be reduced.

Also, in accordance with the embodiments, by distributing the sense amplifiers, fewer sense amplifiers may be in a sense amplifier section. In this way, only one drive line and driver may be needed to provide a drive for the sense amplifiers in a sense amplifier section. In this way, layout in these regions may be improved.

In accordance with the embodiments, although all bit lines in an activated cell array may be activated, by providing adjacent bit line pairs offset from an adjacent bit line by essentially one-half a bit line length, cross-talk between adjacent bit line pairs may be reduced. Also, because a cell array adjacent to an active cell array may not be activated, essentially one-half a bit line may be adjacent to an inactive bit line during an activation cycle. In this way, noise on an active bit line may further be reduced.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a plurality of cell arrays with adjacent cell arrays separated by a row of sense amplifiers;
   a plurality of bit lines, each bit line connected to a plurality of memory cells in each of the plurality of cell arrays; and
   each bit line of the plurality of bit lines is connected to a sense amplifier not included in the row of sense amplifiers separating the adjacent cell arrays in the plurality of cell arrays.

2. The semiconductor memory device according to claim 1, wherein:
   each sense amplifier in the row of sense amplifiers separating adjacent cell arrays is connected to a bit line, separate from the plurality of bit lines, in each of the adjacent cell arrays.

3. The semiconductor memory device according to claim 1, wherein:
   the plurality of bit lines are a plurality of complementary bit line pairs.

4. The semiconductor memory device according to claim 1, wherein:
   adjacent ones of the plurality of bit lines are separated by at least one bit line separate from the plurality of bit lines and that is connected to a plurality of memory cells in a different cell array from the plurality of cell arrays.

5. The semiconductor memory device according to claim 1, wherein:
   the semiconductor memory device is a dynamic random access memory.

6. A semiconductor memory device, comprising:
   a plurality of cell arrays, each cell array including a plurality of memory cells;
   a plurality of sense amplifier sections, each sense amplifier section including a plurality of sense amplifiers being provided adjacent to one of the plurality of cell arrays; and
   each sense amplifier connected to a bit line that is connected to memory cells in at least two cell arrays of the plurality of cell arrays.

7. The semiconductor memory device of claim 6, wherein:
   the plurality of cell arrays are disposed in a first direction parallel to the bit line;
   the plurality of cell arrays includes a first cell array adjacent to a second cell array; and
   the plurality of sense amplifier sections includes a first sense amplifier section on a first side of the first cell array and a second sense amplifier section on a second side of the first cell array and disposed between the first and second cell arrays wherein when the first cell array is activated, the first and second sense amplifier sections are activated and when the second cell array is activated, the first and second sense amplifier sections are activated.

8. The semiconductor memory device of claim 7, further including:
   a third sense amplifier section on the opposite side of the second cell array from the second sense amplifier section wherein when the first cell array is activated, the first, second and third sense amplifier sections are activated and when the second cell array is activated, the first, second and third sense amplifier sections are activated.

9. The semiconductor memory device of claim 6, wherein:
   each sense amplifier section includes a sense amplifier driver circuit coupled to the plurality of sense amplifiers.

10. The semiconductor memory device of claim 9, wherein:
    the plurality of cell arrays includes an end cell array;
    the plurality of sense amplifier sections includes an end sense amplifier section and the sense amplifier driver circuit in the end sense amplifier section has a smaller drive strength than the sense amplifier driver circuit in other ones of the plurality of sense amplifier sections.

11. The semiconductor memory device of claim 6, wherein:
    each bit line is a complementary bit line pair; and
    adjacent sense amplifiers in each of the plurality of sense amplifier sections are connected to complementary bit line pairs that are separated by at least three complementary bit line pairs.

12. The semiconductor memory device of claim 6, wherein:
    the plurality of cell arrays includes an end cell array;
    the plurality of sense amplifier sections includes an end sense amplifier section; and
    the plurality of sense amplifiers in sense amplifier sections disposed between adjacent cell arrays are shared sense amplifiers and the plurality of sense amplifiers in the end sense amplifier section are unshared sense amplifiers.

13. A semiconductor memory device, comprising:
    a first cell array and a second cell array;
    a first sense amplifier section including a plurality of sense amplifiers on a first side of the first cell array;
    a second sense amplifier section including a plurality of sense amplifiers on an opposite side of the first cell array and between the first and second cell array; and
    each one of the plurality of sense amplifiers in the first sense amplifier section is electrically connected to a bit line that is connected to a plurality of memory cells in the first cell array and a plurality of memory cells in the second cell array.

14. The semiconductor memory device of claim 13, wherein:
    each one of the plurality of sense amplifiers in the second sense amplifier section is electrically connected to a bit line that is connected to a plurality of memory cells in the first cell array and to a separate bit line that is electrically connected to a plurality of memory cells in the second cell array.

15. The semiconductor memory device of claim 13, wherein:
    when the first cell array is active, at least one of the bit lines that is connected to a plurality of memory cells in the first cell array and a plurality of memory cells in the second cell array is adjacent to a bit line in the second cell array that is in a precharge state.

16. The semiconductor memory device of claim 15, wherein:
    when the first cell array is active, the at least one of the bit lines that is connected to a plurality of memory cells in the first cell array and a plurality of memory cells in the second cell array is adjacent to a bit line in the first cell array that is providing data.

17. The semiconductor memory device of claim 13, wherein:
- a third sense amplifier section including a plurality of sense amplifiers on an opposite side of the second cell array
- wherein each one of the plurality of sense amplifiers in the third sense amplifier section is electrically connected to a bit line that is connected to a plurality of memory cells in the first cell array and a plurality of memory cells in the second cell array.

18. The semiconductor memory device of claim 17, wherein:
- when one of the plurality of memory cells in the first cell array is selected, the first, second, and third sense amplifier sections are activated and when one of the plurality of memory cells in the second cell array is selected, the first, second, and third sense amplifier sections are activated.

19. The semiconductor memory device of claim 17, further including:
- a third memory cell array wherein the third sense amplifier section is disposed on a first side of the third memory cell array and a fourth sense amplifier section is disposed on an opposite side of the third memory cell array and when one of the plurality of memory cells in the second cell array is selected, the first, second, third, and fourth sense amplifier sections are activated.

20. The semiconductor memory device of claim 17, wherein:
- each bit line includes a complementary bit line pair; and
- adjacent bit line pairs connected to sense amplifiers in the first sense amplifier section are separated by a plurality of bit lines that are connected to sense amplifiers in sense amplifier sections other than the first sense amplifier section.

* * * * *